United States Patent [19]
Lee et al.

[11] Patent Number: 5,329,632
[45] Date of Patent: Jul. 12, 1994

[54] CACHE MEMORY SYSTEM, AND COMPARATOR AND MOS ANALOG XOR AMPLIFIER FOR USE IN THE SYSTEM

[75] Inventors: Sheau-Jiung Lee; Gene Yang, both of Taoyuan, Taiwan

[73] Assignee: Acer Incorporated, Taipei, Taiwan

[21] Appl. No.: 23,959

[22] Filed: Feb. 26, 1993

Related U.S. Application Data

[62] Division of Ser. No. 583,228, Sep. 14, 1990, Pat. No. 5,218,246.

[51] Int. Cl.[5] .............................................. G06F 12/08
[52] U.S. Cl. ............................ 395/425; 364/DIG. 1; 364/243.41
[58] Field of Search ... 364/200 MS File, 900 MS File; 395/425

[56] References Cited

U.S. PATENT DOCUMENTS

| | | | |
|---|---|---|---|
| 3,967,247 | 6/1976 | Anderson et al. | 395/250 |
| 4,897,813 | 1/1990 | Kumbasar | 365/49 |
| 4,907,189 | 3/1990 | Branson et al. | 395/425 |
| 5,014,240 | 5/1991 | Suzuki | 365/49 |
| 5,165,029 | 11/1992 | Sawai et al. | 395/425 |
| 5,214,610 | 5/1993 | Houston | 365/233.5 |
| 5,267,210 | 11/1993 | McClure et al. | 365/218 |

*Primary Examiner*—Joseph L. Dixon
*Assistant Examiner*—Matthew M. Kim
*Attorney, Agent, or Firm*—Townsend and Townsend Khourie and Crew

[57] ABSTRACT

The MOS analog multi-bit comparator amplifier for performing the high speed digital multi-bit comparator function which is required, for example, in Cache Tag Random Access Memory of a computer system, and to the MOS analog XOR amplifier for performing the digital XOR function. The MOS analog comparator provided comprises N number of MOS analog XOR means for performing the digital XOR function and a MOS analog NOR means for performing the digital NOR function.

17 Claims, 6 Drawing Sheets

CACHE MEMORY SYSTEM, AND COMPARATOR AND MOS ANALOG XOR AMPLIFIER FOR USE IN THE SYSTEM

This is a division of copending application Ser. No. 07/583,228, filed on Sep. 14, 1990, now U.S. Pat. No. 5,218,246.

BACKGROUND OF THE INVENTION

1. Field of the Invention

This invention relates in general to a Cache memory system for use in computers and more specifically relates to a metal-oxide-semiconductor (MOS) analog multi-bit comparator sense amplifier and MOS analog exclusive-OR (XOR) amplifier for performing the comparison and XOR functions normally performed by digital circuits in computers and to a Cache memory system employing such amplifiers.

2. Description of the Prior Art

In a high speed computer system utilizing high speed central processing unit (CPU), such as the i80386 or i80486 CPU of Intel Corp., the memory data access is a major bottleneck of the throughput of such computer system. To eliminate this bottleneck and increase the throughput, a small and high-speed Cache memory subsystem is added between the CPU and the main memory. The Cache memory increases the effective speed of the main memory by responding quickly with a copy of the most frequently used main memory data. When the CPU tries to read data from the main memory, the high-speed Cache memory will respond first to check if it has a copy of the requested data. Otherwise, a normal main memory cycle will take place. FIG. 1 depicts the Cache memory system arrangement of modern computer system.

A typical Cache memory subsystem consists of Tag Random Access Memory (TagRAM), Data RAM, both being usually in form of high speed Static RAM (SRAM) and control logic. The Data RAM stores a copy of the most frequently used main memory data. The Tag RAM stores addresses of the most frequently used main memory having a copy in Data RAM. When the CPU sends out the address of main memory it tries to access, the Tag RAM makes a comparison between the external CPU address and the data stored in the Tag RAM to determine it is a HIT or a MISS. If it is a HIT, data is accessed from the Cache Data RAM. Otherwise, the data is accessed from the main memory. The HIT and MISS signals appear at the MATCH outputs of the Cache Tag RAMs in FIG. 1. The Memory Read/Write Control Logic then controls the reading and writing of data from the Cache Data RAM or the main memory in response to the HIT, MISS signals.

The performance of the Cache memory subsystem is largely dependent on how fast the Tag R3M can do the Cache Tag comparison or, in other words, the comparison between the address provided by the CPU on the address lines and the addresses stored in the Cache Tag RAMs. Therefore, improving the Tag comparison speed in the Tag RAM becomes a very important design issue in a Cache memory subsystem.

For detailed treatments on the state of art Cache Tag RAM, please refer to "Cache Tag RAM Chips Simplify Cache Memory Design," by David C. Wyland in the Application Note AN-07 by Integrated Device Technology, Inc. of Santa Clara, Calif.

In order to achieve high performance Tag comparison speed, a very advanced manufacturing technology, such as sub-micron complementary-metal-oxide-semiconductor (CMOS) technology or bipolar technology, is usually required. However, those technologies are very complicated and therefore costly.

FIG. 2 depicts a conventional multi-bit Tag comparison architecture which forms a part of the Cache Tag RAM. Data is first read out from the Tag static RAM (SRAM) as differential signals and appear on the bit lines. Since the differential signals representative of the data are of the order of only several hundred millivolts, they are first amplified and converted into CMOS level signal by the sense amplifier. The CMOS level data output from the sense amplifier then are compared with the CPU address A0, . . . , An-1 by a digital comparator to determine a HIT or MISS condition. The prior art digital comparator (shown within dotted lines in FIG. 2) consists of N XOR and not-OR (NOR) gate with N inputs for making N bits data comparison, as shown in FIG. 2. Every XOR makes XOR comparison of each bit and the results are combined at the NOR. These gates are switched between the logic level "1" and "0" by turning the MOSFETs in the XOR- and NOR-gates, either N-channel MOS (NMOS) or P-channel, MOS (PMOS), on and off. PMOS, on and off.

In the physical chip layout, not shown in this application, the interconnection line between the XORs and the NOR are often very long, thereby causing substantial parasitic line capacitance along the interconnection path. In order to drive substantial capacitance between 0 and 5 volts, the logic gates used need to have more driving capability. This requirement makes the logic gate capacitance large. Due to the large line capacitance and gate capacitance, it is difficult to achieve high "speed performance unless an advanced process technology is utilized.

Digital comparators operated by turning the MOS on and off at very high speed generate switching noise, in addition to the power bouncing problem.

SUMMARY OF THE INVENTION

This invention is based on the observation that by using a MOS comparator containing MOS analog XOR amplifiers in the Cache memory, the above-described disadvantages are not present. In the preferred embodiment, the comparator is analog and employs a MOS analog NOR means. The analog XOR amplifier preferably is operated at low gain to reduce switching noise. In the preferred embodiment, the difference between the two outputs of the XOR amplifier is less than 2 volts, and preferably between 1 to 1.2 volts, so that the amplifier can be operated at higher speed. In the preferred embodiment, the analog gates in the XOR amplifier that are controlled by the SRAM outputs are always operated at saturation instead of being switched on and off. This reduces the power bouncing problem and improves the overall circuit stability.

The Cache system of this invention is for use with a computer system having main memory with N-bit address lines. The Cache system includes a data random access memory (Data RAM) for storing a copy of the most frequently used main memory data, and a Tag RAM. The Tag RAM includes a static random access memory (SRAM) for storing the addresses of frequently used main memory data having a copy in the Data RAM. The SRAM has N-bit data output. The Tag RAM also includes a MOS analog comparator for comparing N-bits data output of SRAM with a N-bit address or said N-bits address lines of the computer system. The comparator causes the Data RAM to supply said copy of main memory data when said N-bits data output of the SR are identical to the N-bit address on the address lines of the computer system.

Another aspect of the invention is directed towards a Tag RAM memory device for use in the Cache memory of a computer system with N-bit address lines. The Tag RAM memory device includes a Tag static RAM having N-bit data output and a MOS comparator for comparing the N-bit data output of said static RAM with a N-bit address on said N-bit address lines of the computer system. The comparator comprises MOS analog XOR means, each having an input connected to one bit of address lines of said computer system and having a reference input connected to one bit of said data output of said Tag static RAM for XOR comparison with one bit of said address lines. The comparator further comprises a MOS NOR means having N input gate terminals, each connected to one output of said analog XOR means. The NOR means outputs a logic "1" state when every bit of the address on the address lines of said computer system is identical with a corresponding bit of data output of said Tag RAM. The NOR means outputs a logic "0" state when at least one bit of the address on the address lines of the computer system is not identical with a corresponding bit of data output of said Tag RAM.

Another aspect of the invention is directed towards the MOS comparator used in the Tag RAM memory device and in the Cache system described above. The comparator compares first input data with second input data, where each bit of the first input data corresponds to one bit of the second input data. The comparator comprises a plurality of MOS analog XOR means, each having three inputs, one connected to one bit of the first input data, and the remaining two inputs to two signals representing one bit of the second input signal. In the preferred embodiment, said two representative signals are simply a logic value and its complement. The comparator performs XOR comparison between said one bit of said first input data and the corresponding bit of said second input data.

The comparator further comprises a MOS NOR means having a plurality of input gate terminals, each of which is connected to one output of said analog XOR means, said analog NOR means outputting a logic "1" state when every bit of the first input data is identical with the corresponding bit of the second input data and outputting a logic "0" state when at least one bit of the first input data is not identical with its corresponding bit of the second input data. In the preferred embodiment, the MOS NOR means is analog.

Another aspect of the invention is directed towards a MOS analog XOR amplifier for comparing one bit of a first input signal with one bit of a second input signal. The amplifier comprises a constant current source, a first and a second MOS switch, each having its source terminal connected to said constant current source, the gate terminals of the two switches connected to said one bit of first input signal and its complement respectively, and a first and a second MOS differential pair. The first differential pair has a first and a second input MOS transistors whose source terminals are commonly connected to the drain terminal of the first MOS switch. The second MOS differential pair has a third and a fourth input MOS transistor whose source terminals are commonly connected to the drain terminal of said second MOS switch. The drain terminals of the first and third input MOS transistors are commonly connected to the first output of the analog XOR means and a drain terminal of the second and fourth input MOS transistors are commonly connected to the second output of the analog XOR means.

Said one bit of said second input signal is represented by two different signal values. Each of the two signal values is applied to one of the gate terminals of the two transistors of each differential pair in order to compare the one bit of the first input signal with the one bit of the second input signal.

DESCRIPTION OF THE DETAILED EMBODIMENT

Figure 1:
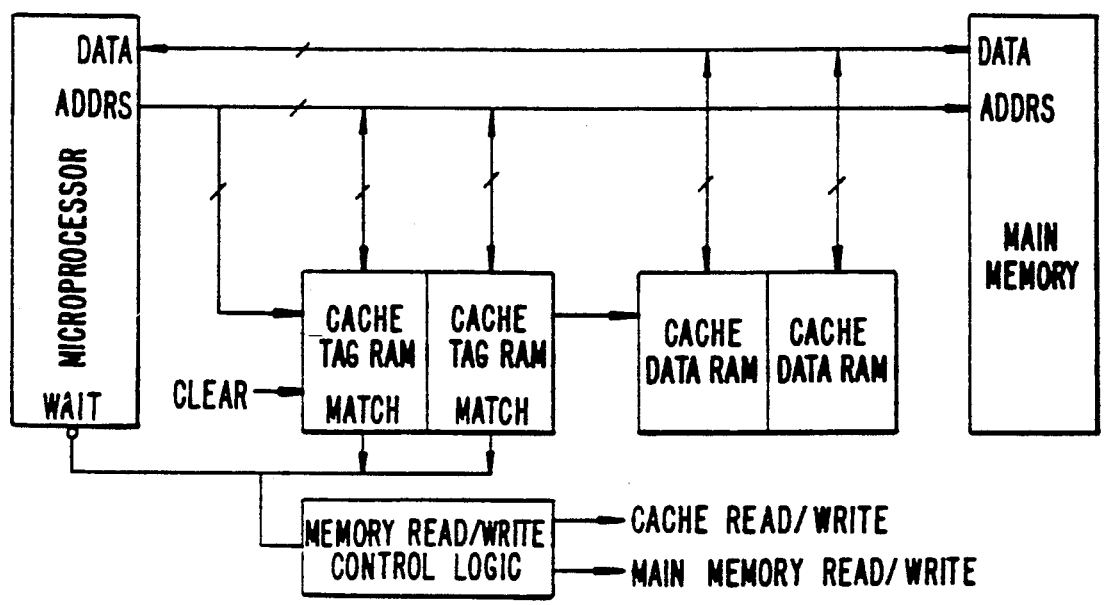
FIG. 1 is an arrangement of the Cache memory subsystem in modern computer system.
Figure 2:
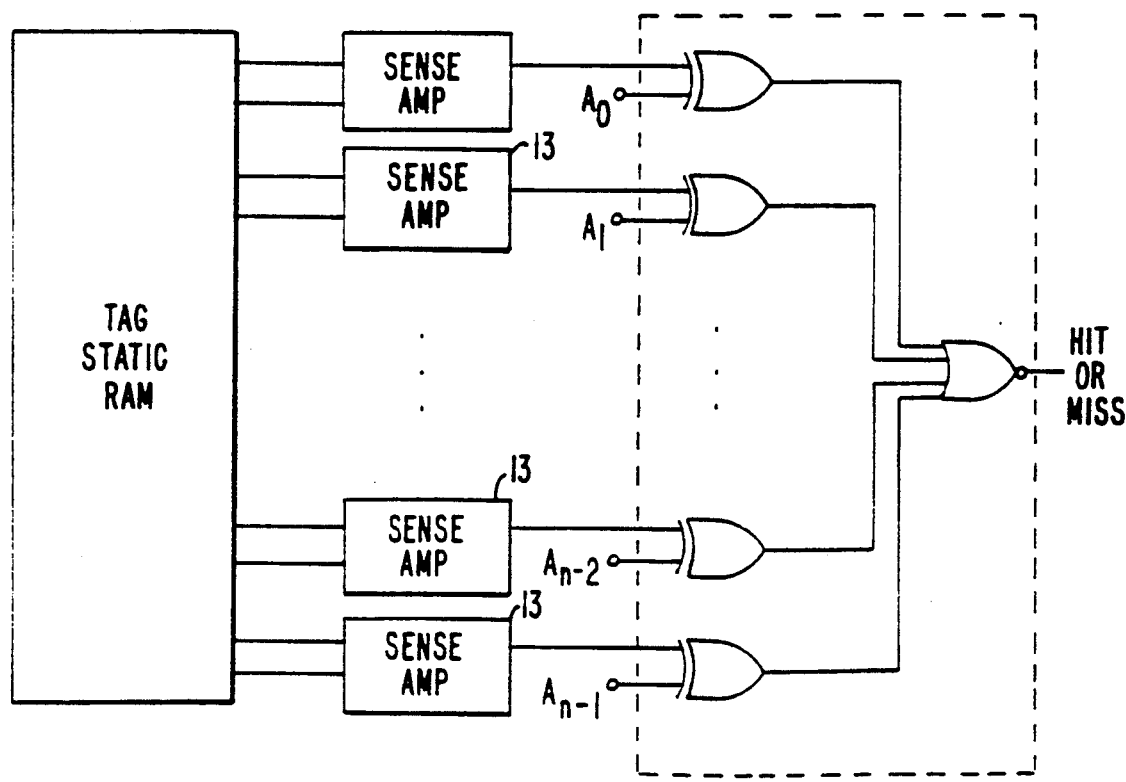
FIG. 2 is N-bit-digital comparator in a Tag RAM in accordance with the prior art.
Figure 3:
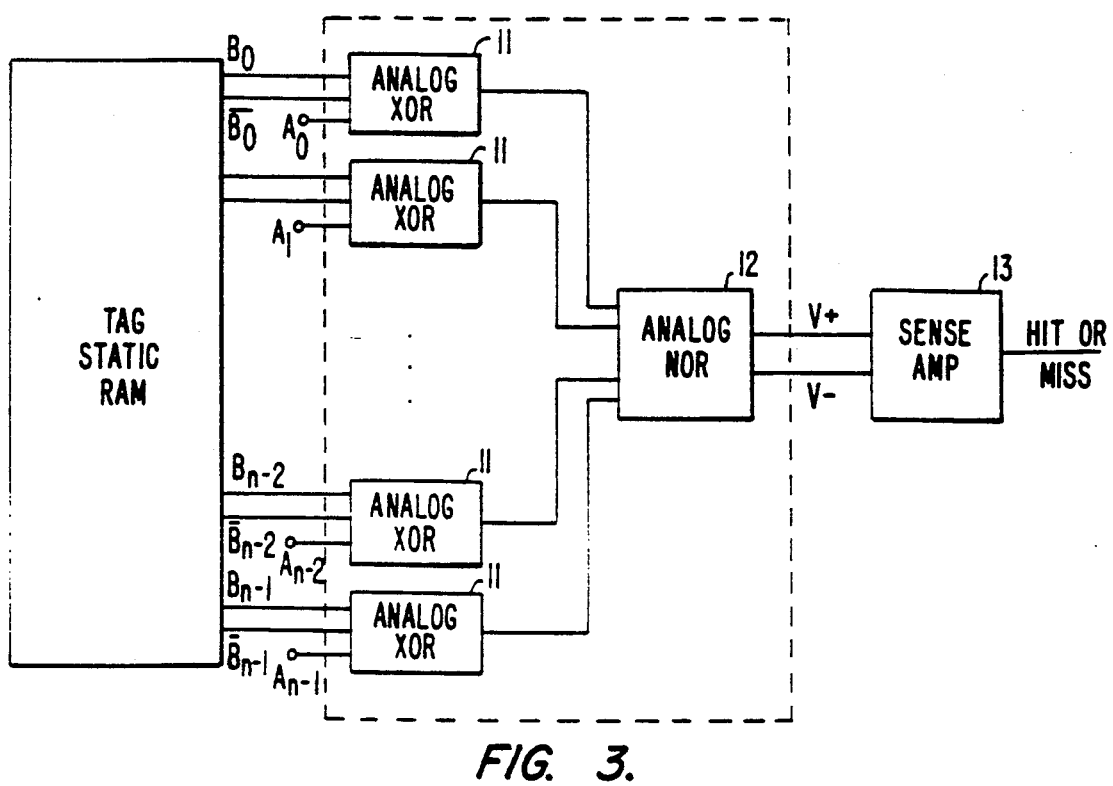
FIG. 3 depicts a static RAM, a N-bit MOS analog comparator, and a sense amplifier in a Tag RAM in accordance with the present invention.

FIG. 3 depicts a static RAM, a N-bit MOS analog comparator 1, and a sense amplifier in a Tag RAM in accordance with the present invention. As opposed to the prior art, the bit line differential signals B0, ..., Bn−1; $\overline{B0}$, ..., $\overline{Bn-1}$ from the static RAM, where n is equal to N, are first sent into N analog XOR circuits 11 to be compared with the corresponding input address A0, ..., An-1 from the CPU on the address lines of the computer system. The results of the comparison of the XOR circuits are combined at the analog NOR circuit 12. The result thereof is finally amplified and converted into a CMOS signal by the sense amplifier 13 determining a HIT or MISS situation. The analog comparator 1 has a better transient response than the digital one in FIG. 2 because of the reasons which will be described in detail in the following related paragraphs.

Figure 4:
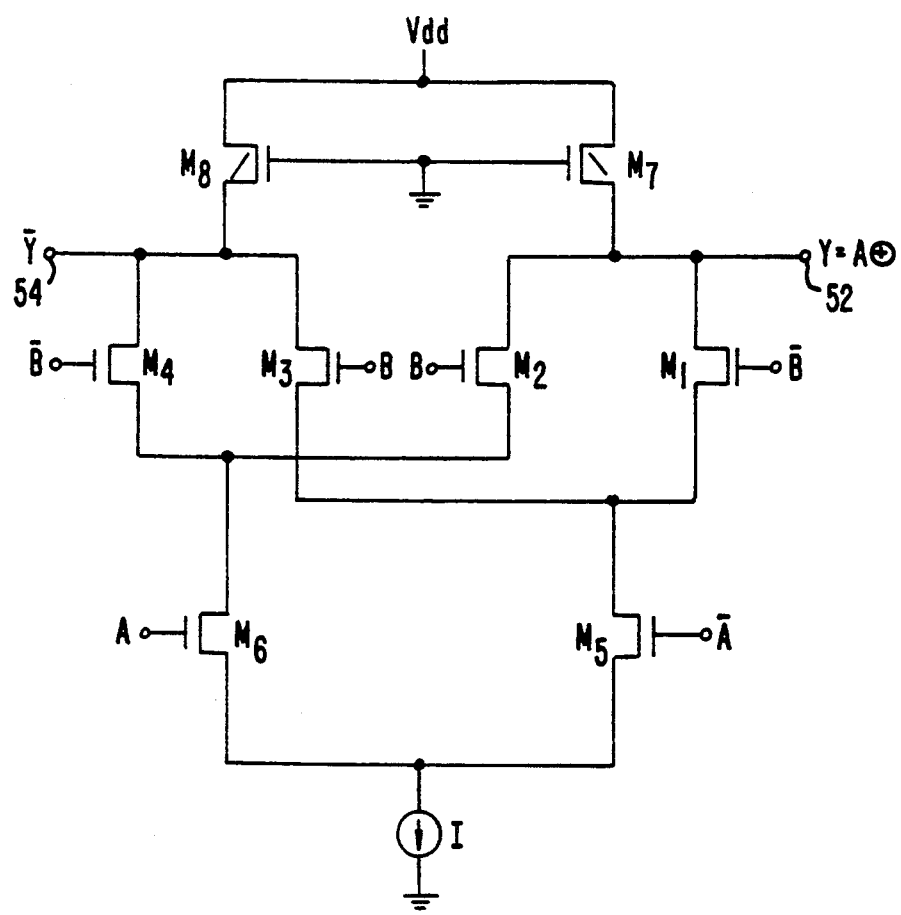
FIG. 4 depicts the MOS analog XOR circuit in accordance with the present invention.

FIG. 4 shows the MOS analog XOR circuit 11 according to the present invention. The analog XOR comprises a current source, two input MOS switches M5 and M6, four MOS field effect transistors (MOSFETs) M1–M4 operated in the saturation region and two pullup transistors M7, M8. The input CPU address A and its complementary signal $\overline{A}$ are CMOS level signals used to control the ON/OFF of the switch M5 and M6. The signal from the static RAM is a differential signal, represented by two voltage signals having several hundreds millivolts difference between them, coming from the Tag static RAM bit line. This differential signal may be written as B and its complementary signal $\bar{B}$. It will be understood, however, that the signal from the static RAMmay be single-ended signal B instead. In such circumstances, the comparator circuit should include one or more inverters for inverting the signal B so that each bit of the signal B and its complement are supplied to the analog XOR circuits 11.

Conceptually, MOS M8, M7, M4, M2, M6 and current source constitute one differential amplifier, while M8, M7, M3, M1, M5 and current source constitute another differential amplifier. In this configuration, M7, M8 are loads common to the two amplifiers. The MOSFETs M1, M3 form a differential pair and so do M2, M4. This special circuit configuration 11 can perform the required XOR function as explained below.

For example, in a typical modern microcomputer system, signal A assumes a logic "0" when it is 0 volt and assumes a logic "1" when it is 5 volts, while differential signal (B, $\bar{B}$) assumes a logic "0" when (B, $\bar{B}$)=(4.7 V, 5 V) and assumes a logic "1" when (B, $\bar{B}$)=(5 V, 4.7 V).

When the input A is low at logic "0," the current flows through differential pairs M1, M3. If input B is higher than $\bar{B}$, then the current in the right pullup transistor M7 will be smaller than that in the left pullup transistor M8. The voltage Y on the output node 52 is going high representing a logic "1." On the contrary, if the input B is lower than $\bar{B}$, the output node 52 will be at a logic "0."

If input A is high at logic "1," then the current flows through differential pairs M2, M4. The current in the right pullup transistor M7 is smaller than that in the left pullup transistor M8 if the signal B is lower than $\bar{B}$. The output Y at 52 is then at "1." But if the signal B is higher than $\bar{B}$, the current through M7 is higher than that through M8, so that output 52 is at "0."

The voltage difference between two output logic levels Y, $\bar{Y}$ at outputs 52, 54 is less than 2 volts and is about 1 to 1.2 volts due to the small voltage gain. From the foregoing statements, if the inputs A, (B, $\bar{B}$) are at different logic levels, the output will be "1." Otherwise, the output will be "0." This is exactly the XOR function as required. Hence the analog XOR circuit 11 performs the same logic function as the conventional digital XOR gate.

In the digital XOR circuit, the logic function is performed by turning ON/OFF of the MOS. Such circuit provides very high gain and therefore, the transient characteristics are degraded due to the high output impedance. But in the analog XOR 11 shown, gain is about two and not large, the output impedance can be greatly reduced and the transient characteristics is improved significantly. Therefore, the analog XOR provided in this invention can be operated at much higher speed.

As indicated above, transistors M1–M4 are operated always in saturation. It is known that a MOSFET has a lower MOS gate capacitance when it is operated in saturation than when it is operated in the linear region. Another benefit of this design is that the input Miller capacitance in each input MOS can be reduced below a certain level since the input MOS M1–M4 can never be driven into the linear region because of the small voltage swing due to the low voltage gain. The input Miller capacitance seen from the input node can be very small and this feature is important since it allows the analog XOR 11 to operate at very high speed.

As described in the above paragraphs, the analog XOR 11 has very good transient characteristics due to its small output impedance and input Miller capacitance. With such good transient characteristics, the voltage difference the XOR circuit 11 needs to drive is only 1 to 1.2 volts rather than the 5 volts. So the analog XOR 11 has high speed performance.

The gates M1-M4 are operated always in saturation instead of being turned ON and OFF as in the conventional design so the gates themselves generate very little noise. This will reduce the power bouncing-problem and improve the overall chip stability. Furthermore, the analog XOR amplifier 11 shown consists of symmetrical differential pairs and a constant current source I. It can be easily fabricated by a low cost PMOS, NMOS or CMOS process technology.

Overall, the analog XOR circuit 11 presented has the advantage of high speed, low noise and easy implementation.

Figure 5:
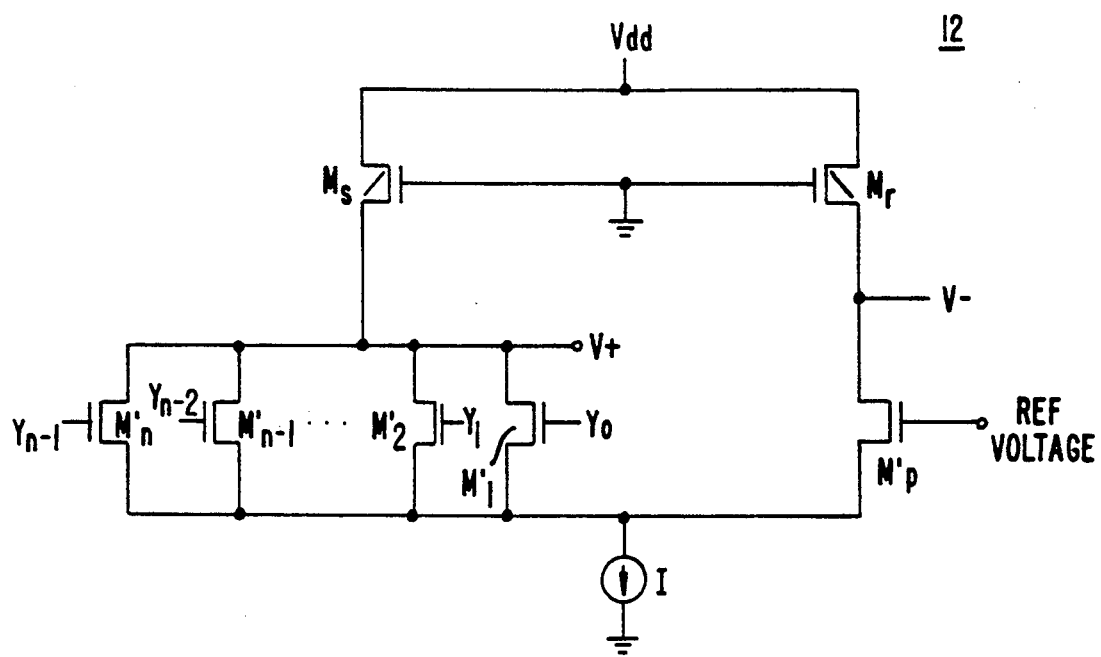
FIG. 5 depicts the MOS analog NOR circuit employed in this invention.

FIG. 5 shows the MOS analog NOR amplifier circuit 12 employed by this invention. The analog NOR circuit 12 comprises constant current source I, input transistor M'0-M'n and the pullup transistor Mr, Ms. The constant current I flows through two transistors Mr, Ms. There are N input transistors on the lefthand side, where n in "M'n" is equal to N. The Y output of comparison of each analog XOR 11 shown in FIG. 3 is connected to the gate terminal of one of the N input transistors M'1–M'n. A reference voltage which lies between the voltage levels of two logic outputs Y, $\bar{Y}$ of the analog XOR gate 11 is applied to the gate of the transistor M'0.

When the N-bit data output Bs of the Tag SRAM is not equal to the CPU address As, at least one output of the analog XOR 11 will go high, then more current will flow through the lefthand side pullup transistor Ms than the right side Mr. Node voltage V+ wall be lower than V− representing a MISS. On the other hand, when the data output Bs of the Tag SRAM is equal to the CPU address As, all inputs to NOR 12 will be "0" and lower than the reference voltage at M'0. The current flows through the lefthand side pullup transistor Ms is smaller than that through the righthand side pullup transistor Mr. The V+ will be higher than V− representing a HIT. The voltage level between two logic levels V+, V− is less than 2 V and is preferably about 1.5 V. Hence the analog NOR 12 performs-the same-function as a digital NOR gate.

The analog NOR circuit 12 shown is a low voltage gain differential amplifier having a small output impedance and Miller capacitance. The analog NOR 12 can drive the line capacitance between 1.5 volts voltage difference at very high speed. The voltage difference between V+ and V− is small, so an additional sense amplifier 13 is needed to amplify and convert the signal into a CMOS level signal as shown in FIG. 3.

For more in-depth explanation on the topics of the analog NOR 12 used by this invention, please refer to the copending U.S. Pat. application Ser. No. 07/318,383 filed on Mar. 3, 1989.

Overall, the analog NOR amplifier circuit 12 used in the analog comparator 1 has the advantage of high speed, low noise and easy implementation.

Since the MOS analog XORs 11 and the analog NOR 12 employed by analog comparator 1 of this invention all have the characteristics of high speed and low noise, the analog comparator 1 shown in FIG. 3 is suitable for high speed operation and can be fabricated by a low cost MOS process technology.

Figure 6:
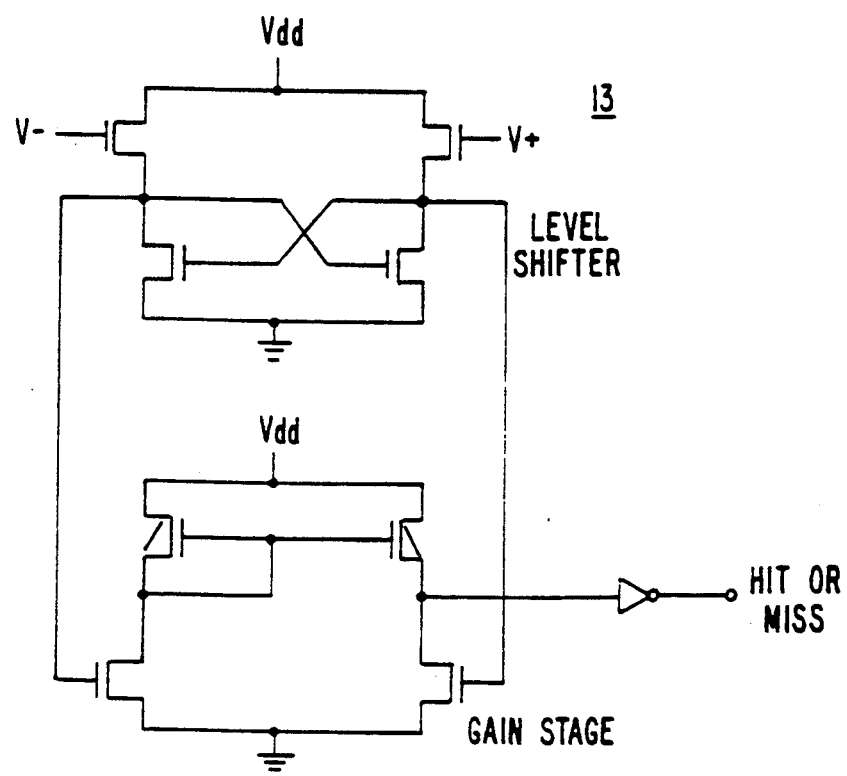
FIG. 6 is a circuit of the sense amplifier in accordance with the prior art.

FIG. 6 shows a prior art sense amplifier 13 used in the analog comparator 1 of this invention. It consists of two stages: the first stage is the level shifter and the second one is the high gain differential amplifier. The level shifter shifts the DC voltage level of the analog NOR differential output V+, V−. The output of the level shifter is then amplified by the differential amplifier stage.

Figure 7:
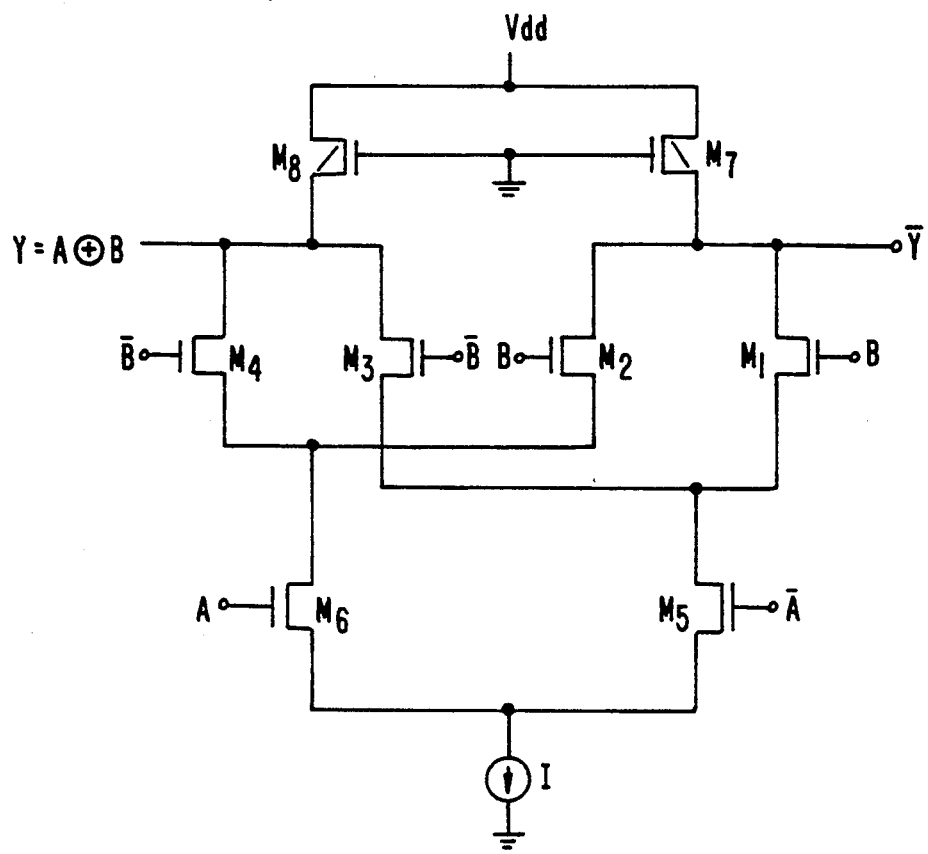
FIG. 7 depicts a second embodiment of the MOS analog XOR circuit in accordance with the present invention.
Figure 8:
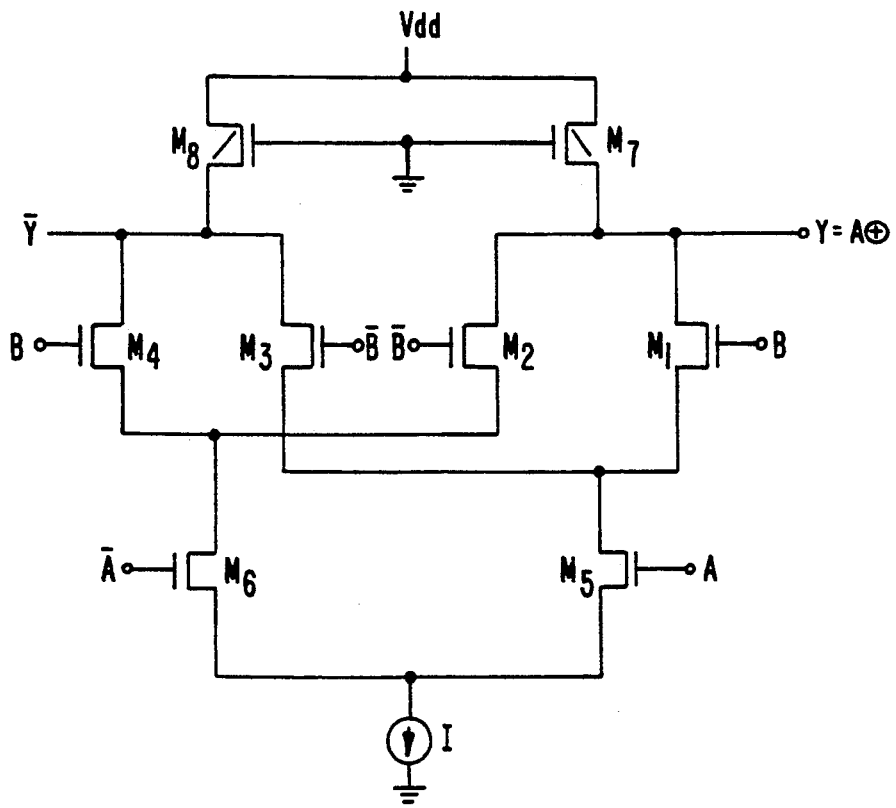
FIG. 8 depicts a third embodiment of the MOS analog XOR circuit in accordance with the present invention.
Figure 9:
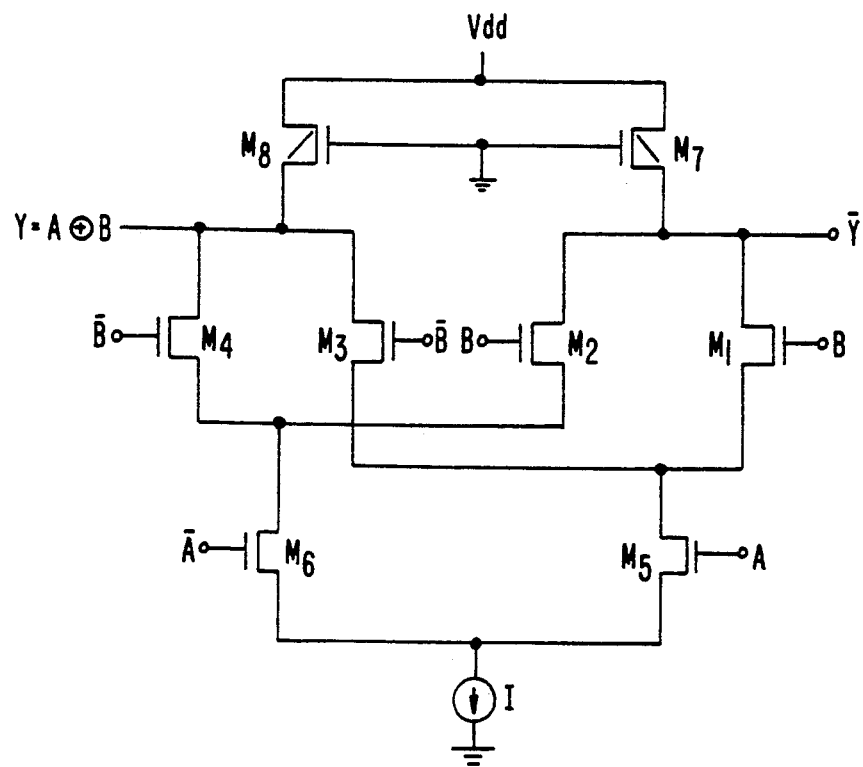
FIG. 9 depicts a fourth embodiment of the MOS analog XOR circuit in accordance with the present invention.

Referring to FIGS. 7, 8 and 9, different embodiments of the MOS analog XOR circuit according to this invention have been shown. The required XOR output is obtained at the common drain terminal of input MOS transistors M3, M4 in FIGS. 7 and 9 while XOR output is obtained at the drain terminal of input MOS transistors M1, M2 in FIG. 8.

Figure 10:
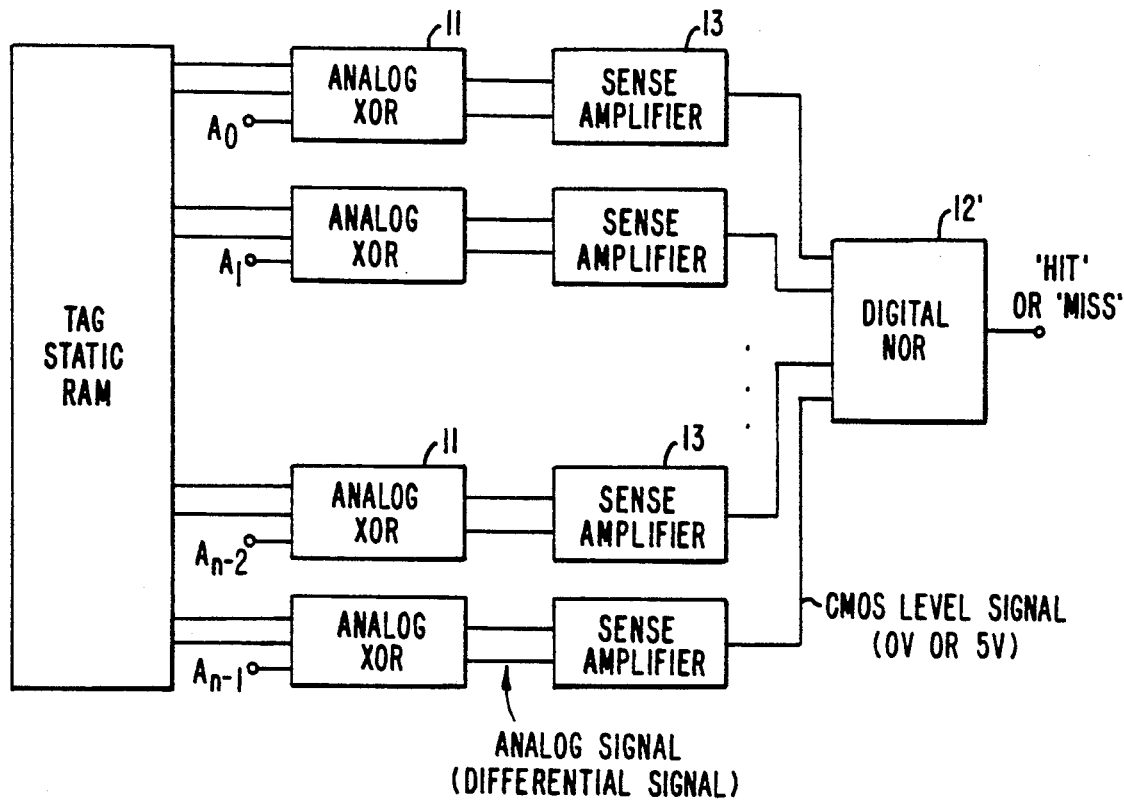
FIG. 10 is a block diagram of a static RAM and a N-bit MOS comparator of a Tag in accordance with another embodiment of the present invention. The comparator includes N analog XOR gates, N sense amplifiers and a digital NOR gate.

While in FIG. 3, circuit 12 is labeled analog NOR, it will be understood that a digital NOR circuit may be used instead. In such event, the outputs of the analog XOR means 11 may need to be amplified by a sense amplifier. In such event, FIG. 3 needs to be modified slightly by passing the outputs of each of the N analog XOR means 11 through N sense amplifiers 13 before they are applied to circuit 12. The outputs V+ and V− of NOR circuit 12 will then be at the proper CMOS digital levels for processing by a digital NOR gate. In other words, FIG. 3 needs to be modified only by placing N sense amplifiers 13 in between the N analog XOR means 11 and the NOR digital circuit 12'. The modified configuration is shown in FIG. 10. Such and other variations are within the scope of the invention.

From FIGS. 4 and 7-9, it is evident that the signal B and its complement may be applied to the four input MOS transistors M1-M4 in various combinations, the only requirement being that for each of the two pairs, M1, M3 and M2, M4, the signal B is applied to the gate terminal of one transistor in each pair and the complement of the signal, $\bar{B}$, is applied to the remaining transistor in each pair. From the above discussion, it is clear that only one of the differential pairs is supplied with current at any one time, so that the two differential pairs essentially operate independently of to one another. Also as shown in FIGS. 4 and 7-9, transistors M1-M6 are N-channeled MOSFETs whereas M7, M8 are P-channeled MOSFETs, so that amplifier 11 is a CMOS analog XOR amplifier. The amplifier in FIGS. 4 and 7-9 can be modified slightly so that M7, M8 are NMOS transistors while the transistors M1-M6 are PMOS transistors. In such event, FIGS. 4, 7-9 need to be modified slightly so that the current source in such figures should be coupled to a Vdd source instead of to ground while the common source terminal of M7, M8 should be grounded or connected to a negative power supply instead of to Vdd. The modified circuits again form CMOS analog XOR amplifiers.

In FIG. 5, the load means Mr, Ms are shown as P-channel MOSFETs; it will be understood that other implementations may be used which are within the scope of the invention. For example, these MOSFETs may be simply replaced by resistors.

The scope of protection intended in this invention is set forth in, but not limited to, the following claims. Any equivalent modification by the persons skillful in this art is deemed to be covered by the attached claims.

What is claimed is:

1. A Cache system of a computer system having a main memory and N-bit address lines, said computer supplying a N bits address to said lines, said main memory storing data, said cache system comprising:

Data Random Access Memory (Data RAM) for storing a copy of frequently used data from said main memory;

a Tag Ram including:
(a) Static Random Access Memory (SRAM) for storing addresses of said frequently used main memory data having a copy in the Data RAM, said SRAM having N bits data output;
(b) a metal oxide semiconductor (MOS) analog comparator for comparing N bits data output of said SRAM with said N bits address on the N bits address lines of said computer system;

wherein said comparator causes the Data RAM to supply said copy of said frequently used main memory data when said N bits data output of said SRAM are identical to the N bits address on the address lines of the computer system;

said MOS analog comparator including:
N number of MOS analog exclusive-OR (XOR) means, each of said analog XOR means having inputs connected to one bit of said address lines to be compared and to one bit of said data output of said SRAM, for performing XOR comparison of said one bit of said data output with one bit of said address lines;

a MOS analog not-OR (NOR) means having N input gate terminals each of which is connected to one output of said analog XOR means, said NOR means outputting a logic "1" state when every bit of said address lines is identical with a corresponding bit of said data output of said SRAM and outputting a logic "0" state when at least one bit of said address lines is not identical with said corresponding bit of said data output of said SRMA, the MOS NOR means including:
a constant current source;
a first and a second load means;
a reference MOS transistor having its source terminal connected to said constant current source, its gate terminal connected to a substantially constant reference voltage and drain terminal connected to the first load means; and
N number of input MOS transistors, the source terminal of each of said input MOS transistors being connected to said constant current source and the drain terminal of each of said input MOS transistors being connected to the second load means, for forming a MOS analog NOR amplifier, wherein drain terminals of said input MOS transistors generate a first output voltage at a node common to said drain terminals of said input MOS transistors and the drain terminal of said reference MOS transistor generates a second output voltage, so that when a logic "0" signal is applied to the input gate terminal of each of said input MOS transistors, the first output voltage is higher than the second output voltage, representing a HIT status, and so that when logic "1" signal is applied to the input gate terminal of at least one input MOS transistor, the second output voltage is higher than the first output voltage, representing a MISS status.

2. The Cache system in accordance with claim 1, wherein said reference MOS transistor and input MOS transistors are N-channel MOS (NMOS) transistors, and said first and second load means are P-channel MOS (PMOS) transistors with drain terminal thereof being coupled to a Vdd source, and an end of said constant current source being grounded or being connected to a negative power supply, for forming a complementary MOS (CMOS) analog NOR amplifier.

3. The Cache system in accordance with claim 1, wherein said reference MOS transistor and input MOS transistors are P-channel MOS (PMOS) transistors, and said first and second load means are N-channel MOS (NMOS) transistors with drain terminal thereof being grounded or being connected to a negative power supply, and an end of said constant current source being connected to a Vdd source, for forming a complementary MOS (CMOS) analog NOR amplifier.

4. The Cache system in accordance with claim 1, wherein said first and second load means are load resistors.

5. A Cache system of a computer system having a main memory and N-bit address lines, said computer supplying a N bits address to said lines, said main memory storing data, said Cache system comprising:

Data Random Access Memory (Data RAM) for storing a copy of frequently used data from said main memory; and a Tag RAM including:
 (a) Static Random Access Memory (SRAM) for storing addresses of said frequently used main memory data having a copy in the Data RAM, said SRAM having N bits data output;
 (b) a metal oxide semiconductor (MOS) analog comparator for comparing N bits data output of said SRAM with said N bits address on the N bits address lines of said computer system;
wherein said comparator causes the Data RAM to supply said copy of said frequently used main memory data when said N bits data output of said SRAM are identical to the N bits address on the address lines of the computer system;
said MOS analog comparator including:
 N number of MOS analog exclusive-OR (XOR) means, each of said analog XOR means having inputs connected to one bit of said address lines to be compared and to one bit of said data output of said SRAM, for performing XOR comparison of said one bit of said data output with one bit of said address lines;
 a MOS not-OR (NOR) means having N input gate terminals each of which is connected to one output of said analog XOR means, said NOR means outputting a logic "1" state when every bit of said address lines is identical with a corresponding bit of said data output of said SRAM and outputting a logic "0" state when at least one bit of said address lines is not identical with said corresponding bit of said data output of said SRAM;
wherein the MOS analog XOR means has a first and a second output, said analog XOR means including:
 a constant current source;
 a first MOS switch having a first source terminal connected to said constant current source, a first gate terminal connected to one bit of said address lines;
 a first MOS differential pair having a first and a second input MOS transistors whose source terminals being commonly connected to a drain terminal of said first MOS switch;
 a second MOS switch having a second source terminal connected to the source terminal of said first MOS switch, a second gate terminal connected to complementary signal of said one bit of said address lines;
 a second MOS differential pair having a third and a fourth input MOS transistors whose source terminals being commonly connected to a drain terminal of said second MOS switch;
wherein drain terminals of the first and third input MOS transistors are connected to the first output of the analog XOR means, and drain terminals of the second and fourth input MOS transistors are connected to the second output of the analog XOR means, and wherein said one bit of said SRAM data output is represented by two different signal values, each of said two signal values being applied to a gate terminal of one of the transistors of each differential pair in order to compare said one bit of said address lines with said one bit of SRAM data output.

6. The Cache system in accordance with claim 5, wherein said MOS differential pairs each comprises an impedance load connected to the drain terminals of said input MOS transistors.

7. The Cache system in accordance with claim 6, wherein said MOS differential pairs share the same impedance load.

8. The Cache system in accordance with claim 6, wherein said impedance load comprises a MOS transistor.

9. The Cache system in accordance with claim 9, wherein the MOS transistor being P-channel MOS (PMOS) transistor, the source terminal of said PMOS transistor being connected to a Vdd source, the MOS switch and input MOS transistors being in form of N-channel MOS (NMOS) type, and an end of said constant current source being grounded or being connected to a negative power supply, for forming a complementary MOS (CMOS) analog XOR amplifier.

10. The Cache system in accordance with claim 8, wherein the MOS transistor being N-channel MOS (NMOS) transistor, the source terminal of said NMOS transistor being grounded or being connected to a negative power supply, the MOS switch and input MOS transistors being in form of P-channel MOS (PMOS) type, and an end of said constant current source being coupled to a Vdd source, for forming a complementary MOS (CMOS) analog XOR amplifier.

11. The Cache system in accordance with claim 6, wherein said impedance load comprises a load resistor.

12. The Cache system in accordance with claim 5, wherein the two different signal values applied to the gate terminals of the first and second input MOS transistors are of opposite logic states, and the two different signal values applied to the gate terminals of the third and fourth input MOS transistors are of opposite logic states.

13. The Cache system in accordance with claim 6, wherein the two different signal values applied to the gate terminals of the first and third input MOS transistors are of opposite logic state to those applied to the gate terminals of the second and fourth input MOS transistors.

14. The Cache system in accordance with claim 5, wherein at most only one of said two MOS switches is on at any time to turn on only one of the two differential pairs at any one time.

15. A Cache system of a computer system having a main memory and N-bit address lines, said computer supplying a N bits address to said lines, said main memory storing data, said cache system comprising:

Data Random Access Memory (Data RAM) for storing a copy of frequently used data from said main memory; and a Tag RAM including:
(a) Static Random Access Memory (SRAM) for storing addresses of said frequently used main memory data having a copy in the Data RAM, said SRAM having N bits data output; and
(b) a metal oxide semiconductor (MOS) analog comparator for comparing N bits data output of said SRAM with said N bits address on the N bits address lines of said computer system, said comparator including a plurality of interconnected transistors in a constantly on state; wherein said comparator causes the Data RAM to supply said copy of said frequently used main memory data when said N bits data output of said SRAM are identical to the N bits address on the address lines of the computer system.

16. The Cache system in accordance with claim 15, said MOS analog comparator comprising:

N number of MOS analog exclusive-OR (XOR) means, each of said analog XOR means having inputs connected to one bit of said address lines to be compared and to one bit of said data output of said SRAM, for performing XOR comparison of said one bit of said data output with one bit of said address lines;

a MOS not-OR (NOR) means having N input gate terminals each of which is connected to one output of said analog XOR means, said NOR means outputting a logic "1" state when every bit of said address lines is identical with a corresponding bit of said data output of said SRAM and outputting a logic "0" state when at least one bit of said address lines is not identical with said corresponding bit of said data output of said SRAM.

17. The Cache system in accordance with claim 16, wherein the MOS NOR means is analog.

* * * * *